United States Patent
Dupont et al.

(10) Patent No.: US 12,002,841 B2
(45) Date of Patent: Jun. 4, 2024

(54) OPTOELECTRONIC DEVICE COMPRISING TWO WIRE-SHAPED LIGHT-EMITTING DIODES EACH HAVING A LAYER THAT LIMITS THE LEAKAGE CURRENTS

(71) Applicant: ALEDIA, Échirolles (FR)

(72) Inventors: Florian Dupont, Grenoble (FR); Jérôme Napierala, Saint Egrève (FR)

(73) Assignee: ALEDIA, Echirolles (FR)

( * ) Notice: Subject to any disclaimer, the term of this patent is extended or adjusted under 35 U.S.C. 154(b) by 369 days.

(21) Appl. No.: 17/613,699

(22) PCT Filed: May 28, 2020

(86) PCT No.: PCT/FR2020/050902
§ 371 (c)(1),
(2) Date: Nov. 23, 2021

(87) PCT Pub. No.: WO2020/240140
PCT Pub. Date: Dec. 3, 2020

(65) Prior Publication Data
US 2022/0231076 A1      Jul. 21, 2022

(30) Foreign Application Priority Data
May 28, 2019   (FR) ..................... 19/05638

(51) Int. Cl.
*H01L 27/15*      (2006.01)

(52) U.S. Cl.
CPC ................... *H01L 27/15* (2013.01)

(58) Field of Classification Search
None
See application file for complete search history.

(56) References Cited

U.S. PATENT DOCUMENTS 7,829,443 B2 * 11/2010 Seifert ................ H01L 29/0665
                                                             257/E33.025
9,947,829 B2 *  4/2018 Ohlsson .............. H01L 21/0237
(Continued)

FOREIGN PATENT DOCUMENTS

EP        2911974 B1      8/2016
JP        2009152474 A    7/2009

OTHER PUBLICATIONS

International Search report dated Oct. 8, 2020 re: Application No. PCT/FR2020/050902, pp. 1-3, citing: US 2019123033 A1, US 2011114915 A1, JP 2009152474 A, US 2014077151 A1 and EP 2911974 B1.

*Primary Examiner* — Bilkis Jahan
(74) *Attorney, Agent, or Firm* — CANTOR COLBURN LLP

(57) ABSTRACT

An optoelectronic device includes first and second light-emitting diodes, each LED having: a first semiconductor portion, with a first type of doping, having a wire-like shape along an axis and having side surfaces parallel to this axis; an active portion arranged at least partially on a top end of the first portion; and a second semiconductor portion, with a second type of doping, arranged at least partially on all or part of the active portion. The optoelectronic device further includes an electrically resistive layer having an electrical resistance that is higher than that of the active portion, covering at least all or part of the side surfaces of the first portion and all or part of the surface of the top end of the first portion not covered by the active portion. The resistive layers of the first and second LEDs are separated from one another.

16 Claims, 3 Drawing Sheets

(56) References Cited

U.S. PATENT DOCUMENTS

| | | | |
|---|---|---|---|
| 9,972,750 B2* | 5/2018 | Herner | H01L 33/42 |
| 2011/0114915 A1 | 5/2011 | Lee et al. | |
| 2011/0309382 A1* | 12/2011 | Lowgren | H01L 33/08 |
| | | | 257/E33.072 |
| 2014/0077151 A1 | 3/2014 | Pougeoise et al. | |
| 2014/0141555 A1* | 5/2014 | Lowgren | H01L 33/62 |
| | | | 977/762 |
| 2014/0370631 A1* | 12/2014 | Thompson | H01L 33/30 |
| | | | 438/34 |
| 2019/0123033 A1 | 4/2019 | Martin | |

* cited by examiner

OPTOELECTRONIC DEVICE COMPRISING TWO WIRE-SHAPED LIGHT-EMITTING DIODES EACH HAVING A LAYER THAT LIMITS THE LEAKAGE CURRENTS

TECHNICAL FIELD

The present disclosure concerns an optoelectronic device including a substrate delimiting a support face and at least one light-emitting diode formed on the support face, having a generally wired shape elongated along a longitudinal axis extending in a first direction oriented transversely to the support face.

The disclosure also concerns a method for manufacturing an optoelectronic device.

The disclosure finds an application in particular in display screens or image projection systems.

BACKGROUND

By «optoelectronic device» is meant here a device suitable for converting an electrical signal into electromagnetic radiation to be emitted, in particular light.

There are optoelectronic devices including light-emitting diodes, also known by the acronym LED for «light-emitting diode», formed on a substrate.

It is known that each light-emitting diode comprises an active material which may or may not use quantum wells, a semiconductor portion doped according to a first type of doping to act like0 an N-doped junction and a semiconductor portion doped according to a second type of doping to act like a p-doped junction.

There are optoelectronic devices including a matrix of light-emitting diodes having a certain emission surface through which the light radiation emitted by the light-emitting diodes is transmitted. Such optoelectronic devices can in particular be used in the constitution of display screens or image projection systems, where the matrix of light-emitting diodes in fact defines a matrix of luminous pixels where each pixel traditionally includes at least one sub-pixel to generate each color, each sub-pixel itself containing at least one light-emitting diode. A sub-pixel can for example contain up to 100,000 light-emitting diodes.

As the resolution of display screens increases, the dimensions of light-emitting surfaces, and therefore of light-emitting diodes, become micrometric or even nanometric. The use of three-dimensional light-emitting diodes is becoming more and more inevitable.

Each three-dimensional light-emitting diode can be formed on the basis of three-dimensional micrometric or even nanometric semiconductor wired elements, themselves at least partially obtained by growth by epitaxy such as metalorganic vapor phase epitaxy (also known by the acronyms MOVPE for) or as epitaxy by molecular beams (MBE for «Molecular Beam Epitaxy») by metalorganic vapor deposition (MOCVD) or by plasma-enhanced chemical vapor deposition (PECVD). Light-emitting diodes are typically formed based on a semiconductor material comprising, for example, elements from column III and from column V of the periodic table, such as a III-V compound, in particular gallium nitride (GaN), indium gallium nitride (InGaN) or aluminum gallium nitride (AlGaN).

The structure of three-dimensional light-emitting diodes may be of the «core-shell» type with a first semiconductor portion doped according to a first type of doping and of a wire form, an active semiconductor portion covering this first portion and a second semiconductor portion doped according to a second doping type and covering the active portion. The first portion being the «core» and the active portion and the second portion forming the «shell» since they surround the first portion.

A second known structure is called «axial». In this architecture, the first semiconductor portion doped according to a first type of doping, the active portion and the second semiconductor portion doped according to a second type of doping are stacked in whole or in part along the longitudinal axis of the light-emitting diode.

One of the difficulties in the axial structure is that the methods for forming the active portion and the second semiconductor portion can hardly make it possible to obtain the active portion and the second semiconductor portion only by covering the first semiconductor portion so as to be stacked along the longitudinal axis of the light-emitting diode. This results in a parasitic deposition on the lateral faces of the wired form of the first portion of the light-emitting diodes. This parasitic deposition is capable of being in electrical contact with the first and second semiconductor portions and of generating leakage currents between the first and second semiconductor portions. A proportion of the current coming from the second semiconductor portion and normally intended to pass through the active portion to the first semiconductor portion passes through the outer parasitic deposition and therefore does not pass through the active portion which generates a loss of electronic efficiency of the light-emitting diode.

A known solution consists in forming one or more electron barrier layers (EBL for «Electron blocking layer») after the formation of the active portion. In the context of a substantially wired light-emitting diode, the electron barrier can nevertheless be deposited in insufficient quantity on the lateral faces of the wired form of the light-emitting diodes. Thus, current leakages may still appear at locations where the electron barrier is thinner or absent.

It is also known practice to obtain chemical passivation of the lateral surfaces of light-emitting diodes, for example to prevent the oxidation of light-emitting diodes. However, this operation is not sufficient to achieve electrical insulation against the aforementioned leakage currents.

In general, obtaining a light-emitting diode with an axial structure is difficult because of the parasitic deposits on the lateral faces of the light-emitting diode.

SUMMARY

The present disclosure responds to all or part of the problems presented above.

In particular, one goal is to provide a solution meeting at least one of the following advantages:
  reducing or even eliminating current leakages between the first semiconductor portion and the second semiconductor portion within the light-emitting diodes;
  increasing the efficiency of light-emitting diodes of axial structure;
  facilitating the formation of light-emitting diodes of axial structure;
  obtaining a light-emitting diode of axial structure without parasitic deposition on its lateral surfaces.

To this end, an optoelectronic device is provided including a substrate delimiting a support face, at least one first light-emitting diode and one second light-emitting diode adjacent to each other, and formed on the support face, the first light-emitting diode and the second light-emitting diode each including:

a first semiconductor portion doped according to a first type of doping having a generally elongated wire shape along a longitudinal axis extending in a first direction oriented transversely to the support face and having lateral surfaces generally parallel to the longitudinal axis, an active portion arranged at least in part on a top end of the first semiconductor portion, opposite the length of the axis to a lower end of the first semiconductor portion facing the support face, a second semiconductor portion doped according to a second type of doping and arranged, at least in part, on all or part of the active portion, an electrically resistive layer whose electrical resistance is greater than that of the active portion, covering at least all or part of the lateral surfaces of the first semiconductor portion and all or part of the surface of the top end of the first semiconductor portion not covered by the active portion;

the electrically resistive layer of the first light-emitting diode and the electrically resistive layer of the second light-emitting diode being separated from each other.

Certain preferred but non-limiting aspects of the optoelectronic device are as follows.

In one implementation of the electronic device, the electrically resistive layer is configured so as to be able to prevent the formation of a material by epitaxy on its free surfaces.

In one implementation of the electronic device, the electrically resistive layer is electrically insulating.

In one implementation of the electronic device, the electrically resistive layer is transparent to all or part of the light radiation emitted by the active portion.

According to a non-limiting embodiment, for each of the first and second light-emitting diodes, the electrically resistive layer does not laterally cover the active portion.

According to a non-limiting embodiment, for each of the first and second light-emitting diodes, the electrically resistive layer does not laterally cover the second semiconductor portion.

According to a non-limiting embodiment, for each of the first and second light-emitting diodes, the electrically resistive layer and the active portion cover, by continuity or overlap, the first semiconductor portion.

According to a non-limiting embodiment, for each of the first and second light-emitting diodes, the electrically resistive layer has a thickness comprised between a lower value of a few angstroms and a higher value of about 200 nm.

According to a non-limiting embodiment, for at least one of the first and second light-emitting diodes, the electrically resistive layer covers all of the lateral surfaces of the first semiconductor portion without laterally covering the active portion, the active portion covers all of the top end of the first semiconductor portion without covering the electrically resistive layer, and the second semiconductor portion covers the upper part and the lateral walls of the active portion until it reaches the electrically resistive layer.

According to a non-limiting embodiment, for at least one of the first and second light-emitting diodes, the electrically resistive layer covers all of the lateral surfaces of the first semiconductor portion without laterally covering the active portion, the active portion covers all of the top end of the first semiconductor portion and all of the free surfaces of the electrically resistive layer, and the second semiconductor portion covers the top part and the lateral walls of the active portion.

According to a non-limiting embodiment, for at least one of the first and second light-emitting diodes, the electrically resistive layer covers all of the lateral surfaces of the first semiconductor portion without laterally covering the active portion, the active portion covers all of the top end of the first semiconductor portion without covering the electrically resistive layer, and the second semiconductor portion covers the upper part and the lateral walls of the active portion and the free surfaces of the electrically resistive layer.

It is also proposed to implement a manufacturing method including the following successive steps of:

a) forming a substrate delimiting a support face;

b) forming at least a first semiconductor portion of at least one first light-emitting diode and a second light-emitting diode adjacent to each other, said at least one first semiconductor portion (112) being doped according to a first type of doping, from the support face and having a wire shape elongated along a longitudinal axis extending in a first direction oriented transversely to the support face, such that the first semiconductor portion comprises a top end opposite the length of the axis to a lower end of the first semiconductor portion facing the support face of the substrate;

c) forming an electrically resistive layer whose electrical resistance is greater than that of an active portion of each of the first and second light-emitting diodes, on all or part of the free surface of the intermediate structure obtained in step b) of the first light-emitting diode and on all or part of the free surface of the intermediate structure obtained in step b) of the second light-emitting diode;

d) etching of a first end of the electrically resistive layer localized at the top end of the first semiconductor portion of the first light-emitting diode and at the first semiconductor portion of the second light-emitting diode, the etching completely passing through the electrically resistive layer so as to expose the top end of the first semiconductor portion;

e) forming said active portion of the first light-emitting diode and of the second light-emitting diode, obtained at least in part on the exposed top end of the first semiconductor portion of the first light-emitting diode and of the second light-emitting diode;

f) forming a second semiconductor portion of the first light-emitting diode and of the second light-emitting diode, obtained at least in part on all or part of the active portion;

method in which, at the end of one of steps c) and d), the electrically resistive layer of the first light-emitting diode and the electrically resistive layer of the second light-emitting diode are separated from one another.

Certain preferred but non-limiting aspects of the manufacturing method are as follows.

In an exemplary embodiment of the method, step d) is carried out by dry etching.

In an exemplary embodiment of the method, step d) is implemented by a directional etching method.

In an exemplary embodiment of the method, the etching step of step d) is implemented by a first dry sub-etching not completely passing through the electrically resistive layer and by a second wet sub-etching exposing the top end of the first semiconductor portion.

In an exemplary embodiment of the method, step e) is carried out by epitaxial growth.

In an exemplary embodiment of the method, step f) is carried out by epitaxial growth.

BRIEF DESCRIPTION OF THE DRAWINGS

Other aspects, aims, advantages and characteristics of the disclosure will become more apparent on reading the following detailed description of preferred embodiments thereof, given by way of non-limiting example, and made with reference to the accompanying drawings in which.

DETAILED DESCRIPTION OF THE DRAWINGS

Figure 1:
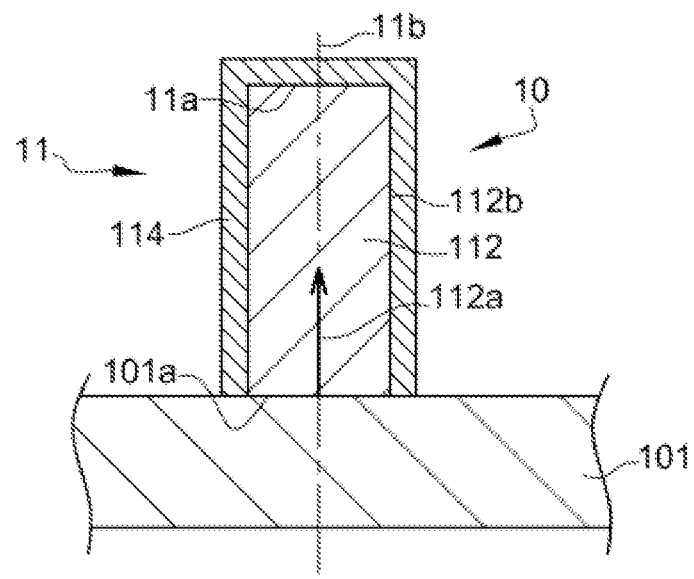
FIG. 1 represents in schematic cross section a first step of a first example of a method for manufacturing a first embodiment of an optoelectronic device according to the disclosure.

In the appended FIGS. 1 to 6 and in the remainder of the description, the same references represent identical or similar elements. In addition, the various elements are not represented to scale so as to favor the clarity of the figures. Moreover, the different embodiments and variants are not mutually exclusive and can be combined with one another.

In the remainder of the description, unless otherwise indicated, the terms «substantially», «about», «generally» and «in the range of» mean «within 10%».

The disclosure relates firstly to an optoelectronic device 10, which firstly includes a substrate 101 having a support face 101a, which is an element common to the various embodiments.

The optoelectronic device 10 also includes at least one first light-emitting diode 11 and one second light-emitting diode 11, adjacent to each other. These two light-emitting diodes, visible in FIG. 6, may or may not be identical, as long as they meet the characteristics described below.

Generally, the optoelectronic device 10 can include a very large number of light-emitting diodes 11, for example several thousand, distributed in the general plane of the support face 101a of the substrate 101. Two light-emitting diodes 11 are said to be adjacent when they are located in immediate proximity one from the other in the general plane of the support face 101a of the substrate 101. More precisely, the second light-emitting diode 11 called «adjacent» to the first light-emitting diode 11 is the light-emitting diode closest to the first light-emitting diode in the general plane of the support face 101a, and vice versa.

Each of the first and second light-emitting diodes 11 is three-dimensional and has, for example, an elongated wire shape along an axis oriented transversely to the support face 101a. Such an organization is very advantageous for obtaining an optoelectronic device 10 with high resolution and high contrast while not generating any limitation as to the materials and techniques used for the manufacture, and while conferring all the known advantages with regard to the use of such wired light-emitting diodes, in particular in terms of cost and efficiency. A particularly targeted application is the supply of an image display screen or an image projection device. But it is clear that the embodiments can concern other applications, in particular the detection or measurement of electromagnetic radiations or else photovoltaic applications.

Each of the first and second light-emitting diodes 11 includes a first semiconductor portion 112 formed (directly by means of physical contact, or indirectly by interposition of a possible intermediate layer) on the support face 101a of the substrate 101. The first semiconductor portion 112 is doped according to a first type of doping, for example of N or P type, but preferably of N type. The first semiconductor portion 112 has a generally wire shape elongated along a longitudinal axis 11b, which extends generally parallel to a first direction 112a oriented transversely to the support face 101a. Thus, the shape of each light-emitting diode 11 is three-dimensional and generally wired. By «generally parallel» is meant that the longitudinal axis 11b and the direction 112a are collinear within 30 µm and oriented at an angle within plus or minus 10° between them.

The first semiconductor portion 112 of each of the first and second light-emitting diodes further has lateral surfaces 112b generally parallel to the longitudinal axis 11b.

Each of the first and second light-emitting diodes 11 also includes an active portion 111 arranged at least in part on the top end 11a of the first semiconductor portion 112. The top end 11a is the end opposite the length of the longitudinal axis 11b at a lower end of the first semiconductor portion 112 facing towards the support face 101a of the substrate 101.

The active portion 111 of the light-emitting diodes 11 is the layer, or the stack of layers, from where the majority of the radiation delivered by the light-emitting diode 11 is emitted. It may include means for confining the carriers of electric charge, such as quantum wells. It is, for example, made up of alternating layers of GaN and an InGaN alloy or even an AlGaInN alloy. The GaN layers can be doped. Alternatively, the active portion 111 consists of a single layer of InGaN for example.

Moreover, each of the first and second light-emitting diodes 11 includes a second semiconductor portion 113 doped according to a second type of doping, for example of N or P type, but preferably of P type in order to be able to form with the first N-doped semiconductor portion 112 a P-N junction. The second semiconductor portion 113 is arranged, at least in part, on all or part of the active portion 111.

In general, the first and second semiconductor portions 112, 113 and the active portion 111 making up the light-emitting diodes 11 can be, at least in part, formed from IV group semiconductor materials such as silicon or germanium or else mainly comprising a III-V compound, for example III-N compounds. Examples of Group III comprise gallium, indium or aluminum. Examples of III-N compounds are GaN, AlN, InGaN or AlInGaN. Other elements of group V can also be used, for example, phosphorus, arsenic or antimony. Generally, the elements in compound III-V can be combined with different mole fractions. It should be noted that the light-emitting diodes 11 can equally well be formed from semiconductor materials predominantly comprising a compound II-VI. The dopant can be selected, in the case of a III-V compound, from the group comprising a P type dopant of group II, for example magnesium, zinc, cadmium or mercury, a dopant of the P type of group IV, for example carbon, or an N-type dopant from group IV, for example silicon, germanium, selenium, sulfur, terbium or tin.

Each of the first and second light-emitting diodes 11 advantageously includes an electrically resistive layer 114, described below both in its arrangement and in its forming method.

The electrically resistive layer 114 can be obtained by virtue, for example, of techniques known to those skilled in the art, such as physical deposition (PVD for «Physical Vapor Deposition») or even chemical vapor deposition (CVD for «Chemical Vapor Deposition»), or equivalent.

The right section of the first and second light-emitting diodes 11 thus formed by the first and second semiconductor portions 112, 113, by the active portion 111 and by the electrically resistive layer 114, taken in any plane parallel to the general plane of the support face 101a, can have different shapes such as, for example, an oval, circular or polygonal shape (for example square, rectangular, triangular or hexagonal).

The disclosure also relates to a method for manufacturing an optoelectronic device 10 having at least two light-emitting diodes.

The substrate 101 is constituted for example by a stack of a monolithic layer (not represented), of a lower electrode layer (not represented) which can be a conductive seed layer and of a first electrically insulating layer (not represented). Those skilled in the art may refer, for example, to patent application FR-A1-3053530 to implement such a substrate 101.

The support face 101a of the substrate 101 is constituted, for example, by the exposed face of said first electrically insulating layer.

The monolithic layer can be formed in a doped or non-doped semiconductor material, for example $Al_2O_3$ or silicon or even germanium, and more particularly monocrystalline silicon. It can also be formed from sapphire or even from a III-V semiconductor material, for example GaN. It may alternatively be a silicon-on-insulator or «SOI» type substrate. Alternatively, the monolithic layer can be formed from an electrically insulating material.

The lower electrode layer can serve as a seed layer for the growth of semiconductor portions of light-emitting diodes. The lower electrode layer can be continuous or discontinuous. The material composing the lower electrode layer can be a nitride, a carbide or an arsenide or a phosphide or a boride of a transition metal from column IV, V or VI of the periodic table of the elements or a combination of these compounds. By way of example, the lower electrode layer can be made of aluminum nitride, aluminum oxide, boron, boron nitride, titanium, titanium nitride, tantalum, tantalum nitride, hafnium, hafnium nitride, niobium, niobium nitride, zirconium, zirconium boride, zirconium nitride, silicon carbide, tantalum nitride and carbide, or magnesium nitride in the form $Mg_xN_y$, where x is about 3 and y is about 2, for example magnesium nitride in the form $Mg_3N_2$. The lower electrode layer can be doped and of the same type of conductivity as that of semiconductor elements intended to grow, and have a thickness for example between 1 nm and 200 nm, preferably between 10 nm and 50 nm. The lower electrode layer may be composed of an alloy or of a stack of at least one material mentioned in the list above.

Said first electrically insulating layer may comprise a first intermediate insulating layer which covers said lower electrode layer. It forms a growth mask authorizing the growth, for example epitaxial, of the light-emitting diodes 11 from through openings opening locally on the surfaces of the lower electrode layer. Said first electrical insulation layer also participates in providing electrical insulation between the first electrodes (not represented) and the second electrodes (not represented) which are intended for the electrical connection respectively to the first semiconductor portion 112 and to the second semiconductor portion 113 of the various light-emitting diodes 11. The first intermediate insulating layer is made of at least one dielectric material such as, for example, a silicon oxide (for example $SiO_2$ or SiON) or a silicon nitride (for example $Si_3N_4$ or SiN), or even silicon oxynitride, aluminum oxide (eg $Al_2O_3$) or hafnium oxide (eg $HfO_2$). This first intermediate insulating layer can also be formed from a large gap semiconductor material such as AlN. The thickness of the first intermediate insulating layer may be comprised between 5 nm and 1 μm, preferably comprised between 20 nm and 500 nm, for example equal to about 100 nm.

Said first electrically insulating layer may further include a second electrically intermediate insulating layer (not represented) which covers the first electrodes and participates in providing electrical insulation between the first electrodes and the second electrodes already mentioned above. This second electrically intermediate insulating layer can also cover the growth mask formed by the first intermediate insulating layer. The second intermediate insulating layer can be made of a dielectric material identical to or different from that of this growth mask, such as, for example, a silicon oxide (for example $SiO_2$) or a silicon nitride (for example $Si_3Na$ or SiN), or even a silicon oxynitride, an aluminum oxide (for example $Al_2O_3$) or a hafnium oxide (for example $HfO_2$). The thickness of the second intermediate insulating layer may be comprised between 5 nm and 1 μm, preferably between 20 nm and 500 nm, for example equal to about 100 nm.

The electrically resistive layer 114 has an electrical resistance greater than that of the active portion 111, and covers at least all or part of the lateral surfaces 112b of the corresponding first semiconductor portion 112.

On the other hand, the electrically resistive layer 114 does not laterally cover the active portion 111. In other words, the electrically resistive layer 114 does not directly or indirectly cover all or part of the lateral faces of the active portion 111.

Likewise, the electrically resistive layer 114 does not laterally cover the second semiconductor portion 113.

The electrically resistive layer 114 and the active portion 111 cover, by continuity or overlap, the first semiconductor portion 112 so that there can be no short-circuit between the first semiconductor portion 112 and the second semiconductor portion 113. Thus, the second semiconductor portion 113 does not come into electrical contact with the first semiconductor portion 112. Likewise, this makes it possible to avoid short-circuits between the first semiconductor portion 112 and an element of another adjacent light-emitting diode 11.

The respective electrically resistive layers 114 of at least the first light-emitting diode 11 and the second light-emitting diode 11, adjacent to one another, have the particularity of being separated from one another.

By «separate», it must therefore be understood that they are distinct and distant from each other. Thus, a parasitic deposition obtained during the formation of the active portion 111 or of the second semiconductor portion 113 on the electrically resistive layers 114, does not lead to the formation of a short-circuit, due to this parasitic deposition, between the two adjacent light-emitting diodes 11.

In other words, the space separating two adjacent light-emitting diodes must not be filled with an electrically resistive layer extending at the same height as the first semiconductor portion 112 before the step of growing the active portion 111, as described in particular in the publication US2011/0114915.

Figure 6:
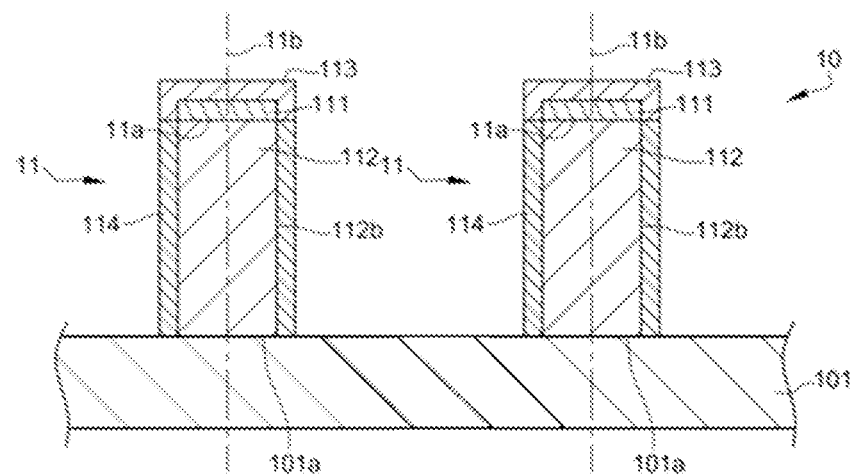
FIG. 6 illustrates a schematic cross section of a fourth embodiment of an optoelectronic device according to the disclosure comprising at least two adjacent light-emitting diodes whose respective electrically resistive layers are separated from one another.

These arrangements are clearly visible in FIG. 6.

The associated technical effect is that a potential parasitic deposition, occurring during the formation of the active portion 111, is thus not formed continuously between the two active portions 111 of two adjacent light-emitting diodes 11. This is to prevent short-circuits between the light-emitting diodes 11.

For purposes of illustration only, but without any limitation, each of FIGS. 1 to 5 represents a single light-emitting diode 11 of the optoelectronic device 10, this being purely by way of illustration. Indeed, the number of light-emitting diodes 11 is, once again, not limited in itself and may be greater than several thousand.

However, to fully understand the principle of the separation between the electrically resistive layers 114 of the adjacent light-emitting diodes 11, FIG. 6 illustrates precisely a first light-emitting diode 11 and a second light-emitting diode 11 adjacent to one another.

According to one embodiment, the electrically resistive layers 114 form thin walls on the lateral surfaces 112b of the first semiconductor portions 112 of the first and second light-emitting diodes 11.

By «thin wall», it is understood that for each of the first and second light-emitting diodes 11, the electrically resistive layer 114 has a thickness between a lower value of a few angstroms, for example 5 angstroms, and a higher value of about 200 nm. Preferably, the thickness of the electrically resistive layer 114 is comprised between 3 nm and 50 nm, and is preferably about 20 nm.

Figure 3:
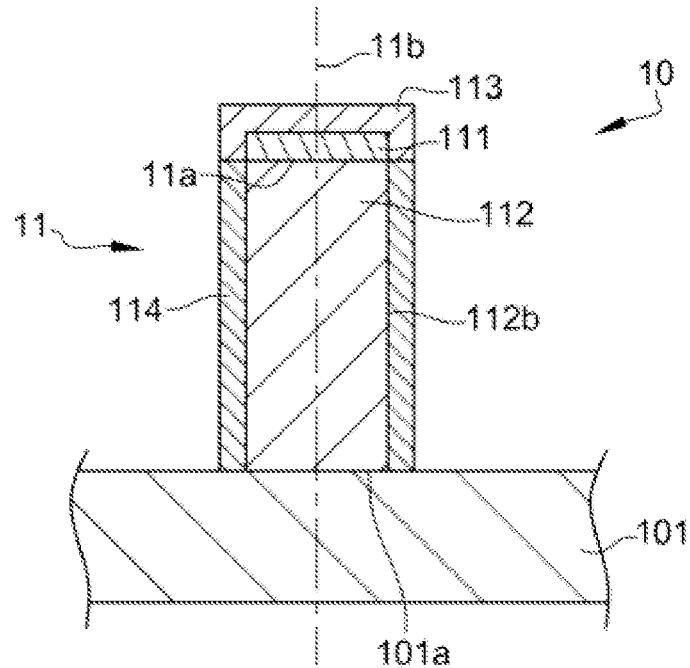
FIG. 3 represents, in schematic cross section, a third step of the first example of a method for manufacturing the first embodiment of an optoelectronic device according to the disclosure.

In FIG. 3, there is illustrated a first embodiment where for at least one of the first and second light-emitting diodes 11:
the electrically resistive layer 114 covers all of the lateral surfaces 112b of the first semiconductor portion 112 but without laterally covering the active portion 111,
the active portion 111 covers all of the top end 11a of the first semiconductor portion 112 left exposed or exposed beforehand but without covering the electrically resistive layer 114,
and the second semiconductor portion 113 covers the upper part and the lateral walls of the active portion 111 until it reaches the electrically resistive layer 114.

Thus, in this first embodiment, there is no surface of the top end 11a of the first semiconductor portion 112 not covered by the active portion 111, so that the electrically resistive layer 114, in this particular case, does not cover any surface of the top end 11a of the first semiconductor portion 112. It could be otherwise in the case where the active portion 111 only partially covers the surface of the top end 11a.

Such an arrangement of the active portion 111, only on the top end 11a and without covering the top end of the electrically resistive layer 114, can be obtained advantageously by virtue of a choice of the nature of the electrically resistive layer 114, which may potentially be able to prevent the growth of a material by epitaxy on its surface, unlike the zone corresponding to the marked top end 11a. This helps to build up what is known as a growth mask. This can be obtained by using materials such as $SiO_2$, SiN, SiON or even $TiO_2$ for the electrically resistive layer 114. In the case where the electrically resistive layer 114 is able to prevent epitaxial growth on its free surfaces, then, once the active portion 111 formed by selectively epitaxy on the top end 11a of the first semiconductor portion 112, the second semiconductor portion 113 obtained by epitaxy is therefore formed selectively only from the active portion 111. This combination of materials and this arrangement of various portions and layers advantageously makes it possible to create a light-emitting diode 11 having an axial structure whose lateral surfaces are free from current leakages between the first and the second semiconductor portions 112, 113. Indeed, the electric current will preferably pass through the active portion 111 which is less electrically resistive than the electrically resistive layer 114.

This makes it possible to limit the risks of short-circuits between the first semiconductor portion 112 and the second semiconductor portion 113 of the same light-emitting diode 11 but also between the first semiconductor portion 112 of a light-emitting diode 11 and an element of another adjacent light-emitting diode 11.

For example, the electrically resistive layer 114 has an electrical resistivity greater than 1 Ohm·m. Preferably, the electrically resistive layer 114 is transparent to at least part of the light radiation intended to be emitted by the active portion 111. Typically, it allows passing more than 30% of the light emitted by the active portion 111 and which passes through it.

Figure 4:
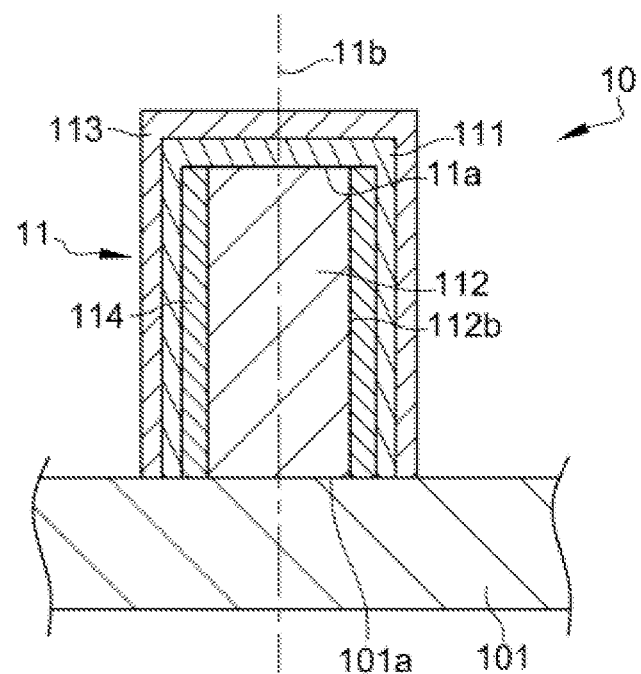
FIG. 4 represents a schematic cross section of a second embodiment of an optoelectronic device according to the disclosure containing a light-emitting diode.

In FIG. 4, there is illustrated a second embodiment where for at least one of the first and second light-emitting diodes 11:
the electrically resistive layer 114 covers all of the lateral surfaces 112b of the first semiconductor portion 112 but without laterally covering the active portion 111,
the active portion 111 covers both the entire top end 11a of the first semiconductor portion 112 left exposed or exposed beforehand and all of the free surfaces (top and lateral) of the electrically resistive layer 114,
and the second semiconductor portion 113 covers the upper part and the lateral walls of the active portion 111, typically until it reaches the support face 101a of the substrate 101.

Thus, in this second embodiment, there is no surface of the top end 11a of the first semiconductor portion 112 not covered by the active portion 111, so that the electrically resistive layer 114, in this particular case, does not cover any surface of the top end 11a of the first semiconductor portion 112. It could be otherwise in the case where the active portion 111 only partially covers the surface of the top end 11a.

The situation in FIG. 4 is therefore obtained for example by forming the active portion 111 on the top end 11a of the first semiconductor portion 112, left exposed or exposed beforehand, as well as on the lateral and upper free surfaces of the electrically resistive layer 114, for example by epitaxy. Then the active portion 111 is covered by the second semiconductor portion 113 obtained for example by the MOVPE technique.

This arrangement makes it possible to limit the risks of short-circuits between the first semiconductor portion 112 and the second semiconductor portion 113 of the same light-emitting diode 11 but also between the first semiconductor portion 112 of a light-emitting diode 11 and a portion of another adjacent light-emitting diode 11. In this second embodiment, the electrically resistive layer 114 is not arranged to be a mask for epitaxial growth, but is simply arranged so as to be more electrically resistive than the active portion 111. In one example, the electrically resistive layer 114 is completely electrically insulating with a resistivity greater than 1 Ohm·m. The electrically resistive layer 114 does not laterally cover the active portion 111. The material used to form the electrically resistive layer 114 may for example be selected from among AlN, $Al_2O_3$, $TiO_2$, SiN, $SiO_2$, SiO. In this embodiment, no longer being a mask for growth by epitaxy, the electrically resistive layer 114 allows a growth of the active portion 111 on its free surfaces by an MBE technique for example. The second semiconductor portion 113 then seeing only the active portion 111, it can be formed over the entire free surface of the active portion 111, for example by the MBE or MOVPE techniques. A core-shell type structure is then obtained, the core being the first semiconductor portion 112 and the shell being the combination of the active portion 111 and of the second semiconductor portion 113. Advantageously, thanks to the electrically resistive layer 114 placed between the first semiconductor portion 112 and the active portion 111, current leakages between the first and second semiconductor portions 112, 113 are eliminated. Indeed, the electric current will preferentially pass through the active portion 111 which is less electrically resistive than the electrically resistive layer 114.

Figure 5:
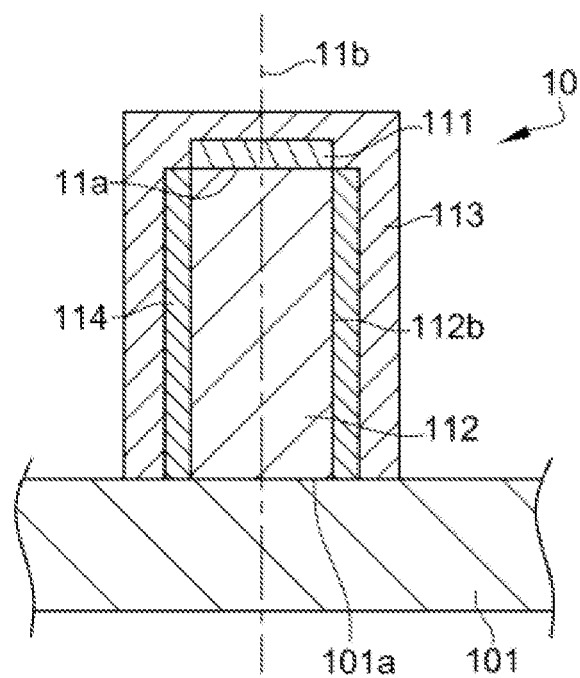
FIG. 5 illustrates a schematic cross section of a third embodiment of an optoelectronic device according to the disclosure containing a light-emitting diode.

In FIG. 5, there is illustrated a third embodiment where for at least one of the first and second light-emitting diodes 11:

the electrically resistive layer 114 covers all of the lateral surfaces 112b of the first semiconductor portion 112 but without laterally covering the active portion 111, the active portion 111 covers all of the top end 11a of the first semiconductor portion 112 left exposed or exposed beforehand without covering the electrically resistive layer 114, and the second semiconductor portion 113 covers the upper part and the lateral walls of the active portion 111 and the free surfaces (top and lateral) of the electrically resistive layer 114, typically until it reaches the support face 101a of the substrate 101.

Thus, in this third embodiment, there is no surface of the top end 11a of the first semiconductor portion 112 not covered by the active portion 111, so that the electrically resistive layer 114, in this particular case, does not cover any surface of the top end 11a of the first semiconductor portion 112. It could be otherwise in the case where the active portion 111 only partially covers the surface of the top end 11a.

The situation in FIG. 5 is therefore obtained for example by forming the active portion 111 by epitaxy according to the MBE technique selectively on the top end 11a of the first semiconductor portion 112, left exposed or exposed beforehand, the electrically resistive layer 114 being arranged only on the lateral walls 112b of the first semiconductor portion 112 and being composed in this example of a material capable of obtaining a growth mask as described above. The second semiconductor portion 113 is arranged on the free surfaces (top and lateral) of the active portion 111 as well as on the free surfaces (lateral and top) of the electrically resistive layer 114. The electrically resistive layer 114 does not laterally cover the active portion 111.

This results in a limitation of the risks of short-circuits between the first semiconductor portion 112 and the second semiconductor portion 113 of the same light-emitting diode 11 but also between the first semiconductor portion 112 of a light-emitting diode 11 and a second semiconductor portion 113 or an active portion 111 of another adjacent light-emitting diode 11.

In general, each light-emitting diode 11, and therefore each first semiconductor portion 112, is electrically connected to a first electrode, typically formed in or on the substrate 101 (not represented and which may be the seed layer), continuous or not. Those skilled in the art will be able to refer to patent application FR-A1-3053530 to produce the substrate 101 containing such first electrodes.

Figure 2:
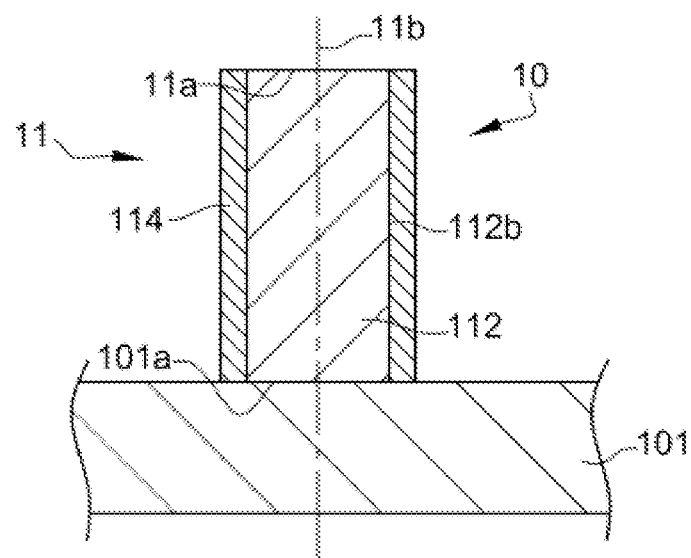
FIG. 2 represents, in schematic cross section, a second step of the first example of a method for manufacturing the first embodiment of an optoelectronic device according to the disclosure.

The disclosure also relates to a method for manufacturing the optoelectronic device 10. FIGS. 1 to 3 represent the steps of a first method for manufacturing an optoelectronic device 10 according to the disclosure.

In general, a method for manufacturing the optoelectronic device 10 described above comprises the following successive steps of:

a) forming a substrate 101 delimiting a support face 101a, b) forming at least one first semiconductor portion 112 of at least one adjacent first light-emitting diode 11 and a second light-emitting diode 11, doped according to a first type of doping, from the support face 101a and having an elongated wire shape along a longitudinal axis 11b extending in a first direction 112a oriented transversely to the support face 101a, so that the first semiconductor portion 112 comprises a top end 11a opposite the length of the axis 11b to a lower end of the first semiconductor portion 112 turned towards the support face 101a of the substrate 101;

c) forming an electrically resistive layer 114, whose electrical resistance is greater than that of an active portion 111 of each of the first and second light-emitting diodes 11, on all or part of the free surface of the intermediate structure obtained at step b) of the first light-emitting diode 11 and over all or part of the free surface of the intermediate structure obtained in step b) of the second light-emitting diode 11;

d) etching a first end of the electrically resistive layer 114 located at the top end 11a of the first semiconductor portion 112 of the first light-emitting diode 11 and at the level of the first semiconductor portion 112 of the second light-emitting diode 11, the etching completely passing through the electrically resistive layer 114 so as to expose the top end 11a of the first semiconductor portion 112;

e) forming said active portion 111 of the first light-emitting diode 11 and of the second light-emitting diode 11, obtained at least in part on the top end 11a exposed from the first semiconductor portion 112 of the first light-emitting diode 11 and of the second light-emitting diode 11;

f) forming a second semiconductor portion 113 of the first light-emitting diode 11 and of the second light-emitting diode 11, obtained at least in part on all or part of the active portion 111;

method in which, at the end of one of steps c) and d), the electrically resistive layer 114 of the first light-emitting diode 11, and the electrically resistive layer 114 of the second light-emitting diode 11) are separated from each other.

The associated technical effect is to prevent short-circuits between all or part of the adjacent light-emitting diodes 11 during parasitic lateral deposition, inevitable in reality and known to those skilled in the art of optoelectronic devices, taking place during the formation of the active portion 111, and of the second semiconductor portion 113.

In a particular embodiment, the etching carried out in step d) is directional. This is possible for example with the use of plasmas such as for example an etching by active ions (RIE for «Reactive Ion Etching»). Another method can be the use of chemical mechanical polishing. Another method can be the use of annealing in a dihydrogen atmosphere.

In one example, the etching carried out in step d) is a dry etching by using, for example, a plasma.

In another example, the etching step d) is implemented by two sub-steps: a first dry or directional sub-etching not completely crossing the electrically resistive layer 114 at the level of the top end 11a and a second wet sub-etching exposing the top end 11a of the first semiconductor portion 112 to promote the resumption of epitaxial growth of the active portion 111 on the top end 11a.

The invention claimed is:

1. An optoelectronic device including a substrate defining a support face, at least one first light-emitting diode and one second light-emitting diode adjacent to each other, and formed on the support face, the first light-emitting diode and the second light-emitting diode each comprising:
   a first semiconductor portion doped according to a first type of doping having a generally wire shape elongated along a longitudinal axis extending in a first direction oriented transversely to the support face and having lateral surfaces generally parallel to the longitudinal axis;
   an active portion arranged at least in part on a top end of the first semiconductor portion, opposite the length of the axis to a lower end of the first semiconductor portion turned towards the support face;
   a second semiconductor portion doped according to a second type of doping and arranged, at least in part, on all or part of the active portion; and
   an electrically resistive layer, whose electrical resistance is greater than that of the active portion, covering at least all or part of the lateral surfaces of the first semiconductor portion and all or part of the surface of the top end of the first semiconductor portion not covered by the active portion,
the electrically resistive layer of the first light-emitting diode and the electrically resistive layer of the second light-emitting diode being separated from each other.

2. The optoelectronic device according to claim 1, wherein the electrically resistive layer is configured so as to be able to prevent formation of a material by epitaxy on its free surfaces.

3. The optoelectronic device according to claim 1, wherein the electrically resistive layer is electrically insulating.

4. The optoelectronic device according to claim 1, wherein the electrically resistive layer is transparent to all or part of the light radiation emitted by the active portion.

5. The optoelectronic device according to claim 1, wherein for each of the first and second light-emitting diodes, the electrically resistive layer does not laterally cover the active portion.

6. The optoelectronic device according to claim 1, wherein for each of the first and second light-emitting diodes, the electrically resistive layer does not laterally cover the second semiconductor portion.

7. The optoelectronic device according to claim 1, wherein for each of the first and second light-emitting diodes, the electrically resistive layer and the active portion cover, by continuity or overlap, the first semiconductor portion.

8. The optoelectronic device according to claim 1, wherein for each of the first and second light-emitting diodes, the electrically resistive layer has a thickness comprised between a value less than a few angstroms and a value greater than about 200 nm.

9. The optoelectronic device according to claim 1, wherein for at least one of the first and second light-emitting diodes, the electrically resistive layer covers all of the lateral surfaces of the first semiconductor portion without laterally covering the active portion, the active portion covers the entire top end of the first semiconductor portion without covering the electrically resistive layer, and the second semiconductor portion covers the upper part and the lateral walls of the active portion until reaching the electrically resistive layer.

10. The optoelectronic device according to claim 1, wherein for at least one of the first and second light-emitting diodes, the electrically resistive layer covers all of the lateral surfaces of the first semiconductor portion without laterally covering the active portion, the active portion covers the entire top end of the first semiconductor portion and the entire free surfaces of the electrically resistive layer, and the second semiconductor portion covers the upper part and the lateral walls of the active portion.

11. The optoelectronic device according to claim 1, wherein for at least one of the first and second light-emitting diodes, the electrically resistive layer covers all of the lateral surfaces of the first semiconductor portion without laterally covering the active portion, the active portion covers the entire top end of the first semiconductor portion without covering the electrically resistive layer, and the second semiconductor portion covers the upper part and the lateral walls of the active portion and the free surfaces of the electrically resistive layer.

12. A method for manufacturing an optoelectronic device, the method including the following successive steps of:
   a) forming a substrate delimiting a support face;
   b) forming at least one first semiconductor portion of at least one first light-emitting diode and one second light-emitting diode adjacent to each other, said at least one first semiconductor portion being doped according to a first type of doping, from the support face and having a wire shape elongated along a longitudinal axis extending in a first direction oriented transversely to the support face, such that the first semiconductor portion comprises a top end opposite the length of the axis to a lower end of the first semiconductor portion facing the support face of the substrate,
   c) forming an electrically resistive layer whose electrical resistance is greater than that of an active portion of each of the first and second light-emitting diodes, on all or part of the free surface of the intermediate structure obtained in step b) of the first light-emitting diode and on all or part of the free surface of the intermediate structure obtained in step b) of the second light-emitting diode,
   d) etching a first end of the electrically resistive layer located at the top end of the first semiconductor portion of the first light-emitting diode and at the level of the first portion semiconductor of the second light-emitting diode, the etching completely passing through the electrically resistive layer so as to expose the top end of the first semiconductor portion,
   e) forming said active portion of the first light-emitting diode and of the second light-emitting diode, obtained at least in part on the top end exposed to the first semiconductor portion of the first light-emitting diode and of the second light-emitting diode, and
   f) forming a second semiconductor portion of the first light-emitting diode and of the second light-emitting diode, obtained at least in part on all or part of the active portion,
   wherein at the end of one of steps c) and d), the electrically resistive layer of the first light-emitting diode, and the electrically resistive layer of the second light-emitting diode are separated from each other.

13. The manufacturing method according to claim 12, wherein step d) is carried out by dry etching.

14. The manufacturing method according to claim 12, wherein step d) is implemented by a directional etching method.

15. The manufacturing method according to claim 12, wherein the etching step of step d) is implemented by a first dry sub-etching not completely passing through the electrically resistive layer and by a second wet sub-etching exposing the top end of the first semiconductor portion.

16. The manufacturing method according to claim 12, wherein step e) and/or step f) is carried out by epitaxial growth.

* * * * *